(12) United States Patent
Lin et al.

(10) Patent No.: US 12,342,630 B2
(45) Date of Patent: Jun. 24, 2025

(54) HETEROJUNCTION SOLAR CELL AND MANUFACTURING METHOD THEREOF

(71) Applicant: Gold Stone (Fujian) Energy Company Limited, Quanzhou (CN)

(72) Inventors: Chaohui Lin, Quanzhou (CN); Kairui Lin, Quanzhou (CN)

(73) Assignee: GOLD STONE (FUJIAN) ENERGY COMPANY LIMITED, Quanzhou (CN)

( * ) Notice: Subject to any disclaimer, the term of this patent is extended or adjusted under 35 U.S.C. 154(b) by 0 days.

(21) Appl. No.: 18/241,318

(22) Filed: Sep. 1, 2023

(65) Prior Publication Data
US 2024/0079511 A1 Mar. 7, 2024

(30) Foreign Application Priority Data

Sep. 1, 2022 (CN) .......................... 202211061849.0
Sep. 8, 2022 (CN) .......................... 202211095468.4

(51) Int. Cl.
*H10F 10/166* (2025.01)
*H10F 71/00* (2025.01)

(52) U.S. Cl.
CPC ....... *H10F 10/166* (2025.01); *H10F 71/1224* (2025.01); *H10F 71/128* (2025.01)

(58) Field of Classification Search
None
See application file for complete search history.

(56) References Cited

U.S. PATENT DOCUMENTS

2024/0063314 A1* 2/2024 Nakayashiki ....... H01L 31/0747

FOREIGN PATENT DOCUMENTS

| CN | 110085699 A | | 8/2019 | |
|---|---|---|---|---|
| CN | 110911505 A | | 3/2020 | |
| CN | 111370521 A | * | 7/2020 | ..... H01L 31/035272 |
| CN | 113113502 A | | 7/2021 | |
| CN | 113471311 A | * | 10/2021 | |
| CN | 111416014 B | * | 3/2022 | ....... H01L 31/02167 |

(Continued)

OTHER PUBLICATIONS

Hyunjung Park, et al., Tunnel oxide passivating electron contacts for high-efficiency n-type silicon solar cells with amorphous silicon passivating hole contacts, Progress in Photovoltaics: Research and Applications, 2019, pp. 1104-1114.

(Continued)

*Primary Examiner* — Dustin Q Dam
(74) *Attorney, Agent, or Firm* — Bayramoglu Law Offices LLC (57) ABSTRACT

A heterojunction solar cell and a manufacturing method thereof are provided. The manufacturing method includes the following steps: A: forming a tunnel oxide layer on a surface of a semiconductor substrate; B: forming an N-type polysilicon layer on the tunnel oxide layer; C: forming a mask layer on the N-type polysilicon layer of a first main surface of the semiconductor substrate; D: performing texturing and cleaning on a second main surface of the semiconductor substrate, and removing the mask layer; E: forming a second intrinsic amorphous silicon layer on the second main surface of the semiconductor substrate; and F: forming a P-type oxygen-doped microcrystalline silicon layer on the second intrinsic amorphous silicon layer.

17 Claims, 7 Drawing Sheets

(56) References Cited

FOREIGN PATENT DOCUMENTS

| CN | 114628538 A | 6/2022 |
|---|---|---|
| CN | 114823936 A | 7/2022 |

OTHER PUBLICATIONS

Muhammad Quddamah Khokhar, et al., High-efficiency hybrid solar cell with a nano-crystalline silicon oxide layer as an electron-selective contact, Energy Conversion and Management, 2022, pp. 1-11, vol. 252 No. 115033.

G. Limodio, et al., Front and rear contact Si solar cells combining high and low thermal budget Si passivating contacts, Solar Energy Materials and Solar Cells, 2019, pp. 28-35, vol. 194.

M. Khelil, et al., Growth of crystalline silicon by a seed layer approach using plasma enhanced chemical vapor deposition, Physica B: Physics of Condensed Matter, 2021, pp. 1-9, vol. 609 No. 412817.

\* cited by examiner

HETEROJUNCTION SOLAR CELL AND MANUFACTURING METHOD THEREOF

CROSS REFERENCE TO THE RELATED APPLICATIONS

This application is based upon and claims priority to Chinese Patent Application No. 202211061849.0, filed on Sep. 1, 2022; and Chinese Patent Application No. 202211095468.4, filed on Sep. 8, 2022, the entire contents of which are incorporated herein by reference.

TECHNICAL FIELD

The present disclosure belongs to the technical field of solar cells, and in particular to a heterojunction solar cell and a manufacturing method thereof.

BACKGROUND

With a high conversion efficiency, low process temperature, high stability and low degradation rate, the heterojunction solar cell has been increasingly popular in the photovoltaic industry and is envisioned as a future development trend for high-conversion-efficiency solar cells.

Heterojunction technology has great development potential due to its simple process, high conversion efficiency, high comprehensive power output, and far lower degradation rate than passivated emitter and rear cell (PERC) technology. However, the plate-type plasma-enhanced chemical vapor deposition (PECVD) coating equipment used for amorphous silicon or microcrystalline silicon is costly. Hence, the heterojunction technology is not advantageous over the PERC technology in terms of the comprehensive equipment cost. It is desirable to improve production technology to further reduce the equipment investment, thereby making comprehensive investment competitive in the markets.

SUMMARY

An objective of the present disclosure is to provide a manufacturing method of a heterojunction solar cell. With a simple process, the manufacturing method keeps not only the high conductivity and low equipment investment of an N-type polysilicon layer, but also the desirable passivation and high open-circuit voltage of a heterojunction technology.

Another objective of the present disclosure is to provide a heterojunction solar cell. The tunnel oxide passivated contact (TOPCON) technology formed by a tunnel oxide layer and an N-type polysilicon layer on a back surface of the heterojunction solar cell has a good passivation effect and a desirable conductivity. A P-type microcrystalline laminated layer is provided on a front surface of the heterojunction solar cell. An oxygen-containing microcrystalline layer enhances an electrical potential barrier, while expanding an optical band gap. This ensures an open-circuit voltage of the cell, and improves a fill factor of the cell.

The objectives of the present disclosure are achieved by the following technical solutions.

A manufacturing method of a heterojunction solar cell includes the following steps:
  A: forming a tunnel oxide layer on a surface of a semiconductor substrate;
  B: forming an N-type polysilicon layer on the tunnel oxide layer;
  C: forming a mask layer on the N-type polysilicon layer of a first main surface of the semiconductor substrate;
  D: performing texturing and cleaning on a second main surface of the semiconductor substrate, and removing the mask layer;
  E: forming a second intrinsic amorphous silicon layer on the second main surface of the semiconductor substrate; and
  F: forming a P-type oxygen-doped microcrystalline silicon layer on the second intrinsic amorphous silicon layer.

A heterojunction solar cell includes a first electrode, a first conductive film layer, a P-type microcrystalline laminated layer, an intrinsic film layer, the semiconductor substrate, the tunnel oxide layer, an N-type semiconductor film layer, a second conductive film layer, and a second electrode that are sequentially stacked from a light-facing surface to a backlight surface, where the P-type microcrystalline laminated layer includes at least one oxygen-containing microcrystalline layer and at least one oxygen-free microcrystalline layer.

The present disclosure has the following advantages over the prior art:
 1. The TOPCON technology formed by the tunnel oxide layer and the N-type polysilicon layer has a good passivation effect and a desirable conductivity. This ensures an open-circuit voltage of the cell, and improves a fill factor of the cell.
 2. The deposited silicon nitride protective layer prevents corrosion of the N-type polysilicon layer in the texturing solution, and takes annealing and hydrogen injection effects. This further improves the passivation effect of the N-type polysilicon layer.
 3. While achieving a single-sided texturing (polishing) effect, the process used by the present disclosure omits roll coating in preparation of the first semiconductor layer. This prevents yield fluctuation and complex manufacture of the pure TOPCON technology.
 4. In the present disclosure, the silicon nitride protective layer on the back surface of the silicon wafer is omitted in the final structure and replaced by the transparent conductive film layer. This prevents damage caused by laser ablation or high-temperature reaction of a paste, and achieves good bonding with the subsequent heterojunction.
 5. While ensuring the conductivity, the P-type oxygen-doped microcrystalline silicon layer expands an optical band gap to prevent serious light absorption of an amorphous P-layer.
 6. With the tunnel oxide layer and the N-type polysilicon layer instead of an amorphous N-layer or a microcrystalline N-layer of a conventional heterojunction technology, the present disclosure reduces equipment investment of the flat-plate PECVD device, and can greatly lower a total cost of the heterojunction device.

In the figures: 1: silicon wafer, 2: tunnel oxide layer, 3: first intrinsic polysilicon layer, 4: N-type polysilicon layer, 5: PSG layer, 6: silicon nitride protective layer, 7: second intrinsic amorphous silicon layer, 8: P-type oxygen-doped microcrystalline silicon layer, 81: first oxygen-free microcrystalline layer, 82: oxygen-containing microcrystalline layer, 83: second oxygen-free microcrystalline layer, 9: transparent conductive layer, and 10: metal grid electrode.

DETAILED DESCRIPTION OF THE EMBODIMENTS

A manufacturing method of a heterojunction solar cell includes the following steps:
- A: A tunnel oxide layer is formed on a surface of a semiconductor substrate.
- B: An N-type polysilicon layer is formed on the tunnel oxide layer.
- C: A mask layer is formed on the N-type polysilicon layer of a first main surface of the semiconductor substrate.
- D: Texturing and cleaning are performed on a second main surface of the semiconductor substrate, and the mask layer is removed.
- E: A second intrinsic amorphous silicon layer is formed on the second main surface of the semiconductor substrate.
- F: A P-type oxygen-doped microcrystalline silicon layer is formed on the second intrinsic amorphous silicon layer.

The manufacturing method further includes the following steps:
- G: A first conductive film layer is formed on the N-type polysilicon layer, and a second conductive film layer is formed on the P-type oxygen-doped microcrystalline silicon layer.
- H: A first metal electrode is formed on the first conductive film layer, and a second metal electrode is formed on the second conductive film layer.

Before Step A, polishing and cleaning are further performed. Specifically, the semiconductor substrate is polished for 1-15 min with an alkaline solution at 65-90° C. to remove a thickness of 1-20 μm, and cleaned with a weak alkaline solution and an acidic solution.

Step A specifically includes: The tunnel oxide layer is formed on the surface of the semiconductor substrate by nitric acid oxidation, ozone oxidation, vacuum plasma-assisted oxidation or thermal oxidation.

In Step A, the thermal oxidation is to charge oxygen for oxidation, an oxygen and nitrogen mixture for oxidation or aerial oxygen for oxidation at 550-650° C.

Step B specifically includes: A first intrinsic polysilicon layer is formed on the tunnel oxide layer. Phosphorus doping is performed on the first intrinsic polysilicon layer by diffusion annealing to form the N-type polysilicon layer and a PSG layer. The PSG layer is removed with a fluorine-containing acidic solution. Or, a phosphorus source is introduced by low-pressure CVD (LPCVD) for in-situ doped growth, thereby forming the N-type polysilicon layer.

In Step B, the first intrinsic polysilicon layer is grown by the LPCVD, or obtained by preparing an amorphous silicon layer and a microcrystalline silicon layer with PECVD and then performing high-temperature annealing, or obtained by sputtering a silicon target material through a physical vapor deposition (PVD) to prepare a silicon thin film and then performing high-temperature annealing.

In a preferred solution, Step A and Step B specifically include: The semiconductor substrate is put into a tubular LPCVD device, and thermally oxidized for 30 min at 550-650° C. to form the tunnel oxide layer. Vacuumization is performed, and a reactant gas is charged to grow the first intrinsic polysilicon layer at 550-650° C. and 5-10,000 Pa, the grown first intrinsic polysilicon layer having a thickness of 20-300 nm. The phosphorus doping is performed on the first intrinsic polysilicon layer by the diffusion annealing to form the N-type polysilicon layer and the PSG layer. The PSG layer is removed with the fluorine-containing acidic solution.

The diffusion annealing in Step B is to perform boron doping on the first intrinsic polysilicon layer at 780-950° C. Upon diffusion, a sheet resistance is 20-200 Ω/square.

Step C specifically includes: At least one of silicon nitride, silicon oxynitride and silicon oxide is deposited on the N-type polysilicon layer by plasma CVD (PCVD) or high-temperature CVD to form the mask layer.

The mask layer has a thickness of 30-150 nm.

Step D specifically includes: A pyramid texture is formed on the second main surface of the semiconductor substrate through the texturing and the cleaning, and the mask layer is removed with a fluorine-containing acidic solution.

The tunnel oxide layer has a thickness of 1-2 nm. The N-type polysilicon layer has a thickness of 20-300 nm. The P-type oxygen-doped microcrystalline silicon layer has a thickness of 5-25 nm.

Step F specifically includes: The P-type oxygen-doped microcrystalline silicon layer laminated by at least one oxygen-containing microcrystalline layer and at least one oxygen-free microcrystalline layer is formed by PECVD or hot-wire CVD. In a preferred solution, a first oxygen-free microcrystalline layer, the oxygen-containing microcrystalline layer, and a second oxygen-free microcrystalline layer are sequentially deposited on the second intrinsic amorphous silicon layer.

In Step F, each film layer in the P-type oxygen-doped microcrystalline silicon layer is deposited by stepwise increasing a ratio of a P-type dopant gas to silane.

Embodiment 1

The present disclosure will be described in detail below with reference to the drawings and Embodiment 1:

FIG. 2 to FIG. 10 are a schematic view in a manufacturing method of a heterojunction solar cell according to an embodiment of the present disclosure.

Figure 1:
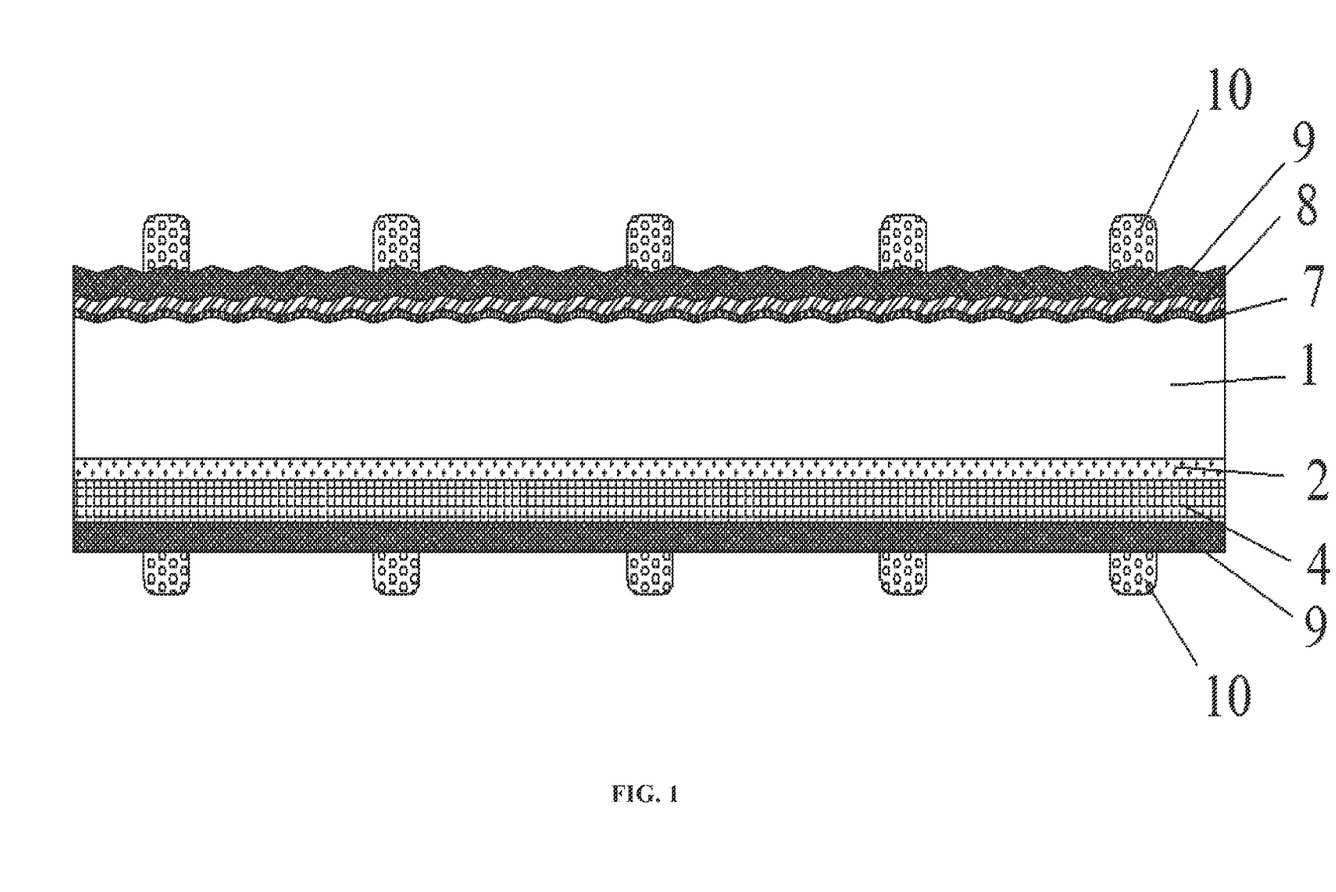
FIG. 1 is a schematic structural view of an efficient heterojunction solar cell according to an embodiment of the present disclosure.
Figure 2:
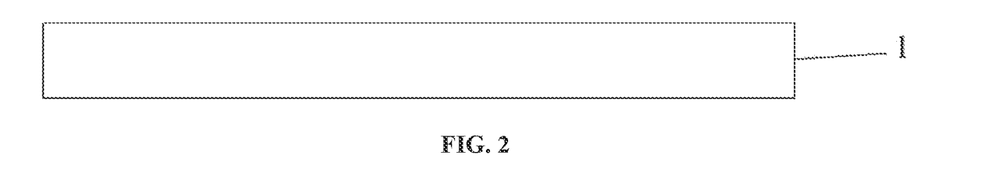
FIG. 2 is a schematic sectional view of a silicon wafer upon double-sided polishing and cleaning according to an embodiment of the present disclosure.

A manufacturing method of a heterojunction solar cell specifically includes the following steps:

(1) Double-sided polishing is performed on N-type monocrystalline or ingot-cast silicon wafer 1. A wire-cutting damaged layer on a surface of the wafer is removed with an alkaline solution. The alkaline solution may be potassium hydroxide, sodium hydroxide or a mixed solution of the potassium hydroxide and the sodium hydroxide. Usually, the alkaline solution has a reaction temperature of 65-90° C., and a reaction time of 1-15 min. For a single side, a thickness of 1-20 μm is removed. Standard reliability change analysis (RCA) cleaning is performed to remove remaining alkaline solution on the surface of the silicon wafer (as shown in FIG. 2).

Figure 3:
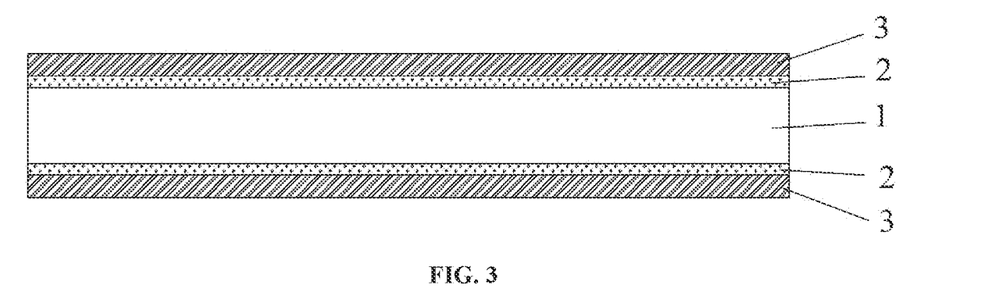
FIG. 3 is a schematic sectional view after a tunnel oxide layer and a first intrinsic polysilicon layer are sequentially formed on a surface of a silicon wafer according to an embodiment of the present disclosure.

(2) Upon the double-sided polishing, the surface of the silicon wafer 1 is oxidized to sequentially form tunnel oxide layer 2 and first intrinsic polysilicon layer 3 (as shown in FIG. 3). Nitric acid oxidation, ozone oxidation or thermal oxidation may be used to oxidize the surface. Preferably, the surface is thermally oxidized for 30 min in a tubular LPCVD device at 550-650° C. to form the tunnel oxide layer 2 with a thickness of 1.2-2.0 nm. The tunnel oxide layer is an ultra-thin silicon oxide layer. The silicon oxide thin film may also be formed by vacuum plasma-assisted oxidation. The first intrinsic polysilicon layer 3 and the tunnel oxide layer 2 are formed in the same tubular LPCVD device. Preferably, upon the thermal oxidation, a gas is pumped, and silane and other gases are charged to grow the first intrinsic polysilicon layer 3 at 550-650° C. and 5-10,000 Pa. The first intrinsic polysilicon layer 3 may have a thickness of 20-300 nm. The first intrinsic polysilicon layer may also be prepared by PECVD and high-temperature annealing. The first intrinsic polysilicon layer may also be prepared by sputtering a silicon target material through PVD to obtain a thin film, and then performing high-temperature annealing.

Figure 4:
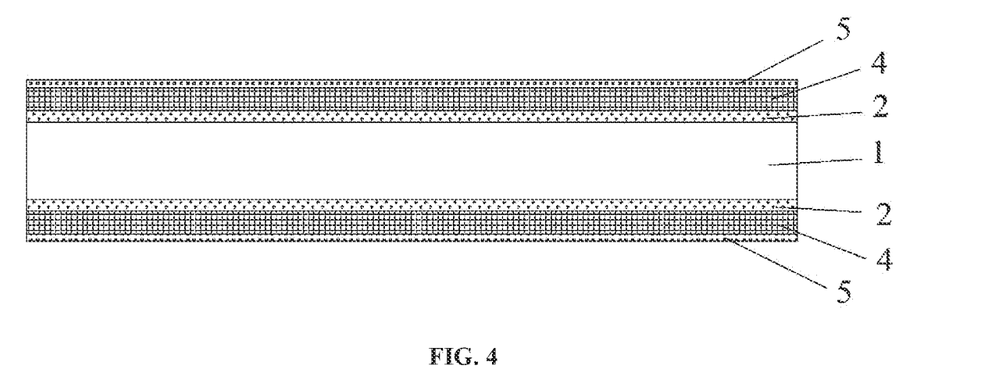
FIG. 4 is a schematic sectional view after a first intrinsic polysilicon layer is converted into an N-type polysilicon layer and a phosphorosilicate glass (PSG) layer is formed on a surface of the silicon wafer upon high-temperature diffusion on the silicon wafer according to an embodiment of the present disclosure.

(3) High-temperature diffusion is performed on the silicon wafer that is oxidized and grown with the polysilicon thin film, and phosphorus doping is performed on the first intrinsic polysilicon layer 3 to form N-type polysilicon layer 4 (as shown in FIG. 4). The diffusion is performed at 780-950° C. Upon the diffusion, the silicon wafer has a sheet resistance of 20-200 Ω/square. N-type doping on the polysilicon may also be performed by in-situ doping (namely a gas containing a phosphorus source is charged to a gas atmosphere for preparing the polysilicon). The in-situ doping can prevent subsequent high-temperature diffusion of the PSG in a furnace tube.

Figure 5:
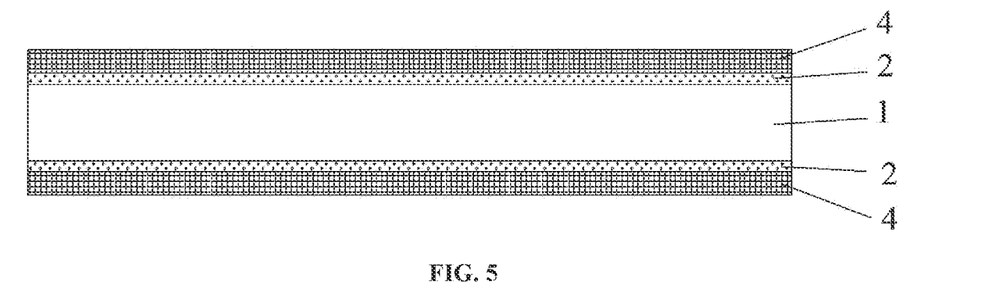
FIG. 5 is a schematic sectional view after a PSG layer on a surface of a silicon wafer is removed according to an embodiment of the present disclosure.

(4) PSG layer 5 formed on the surface of the silicon wafer 1 upon the high-temperature diffusion is removed (as shown in FIG. 5). A cleaning solution for removing the PSG layer includes a fluorine-containing chemical solution (for example, a fluorine-containing acidic solution such as a diluted hydrofluoric (HF) acid solution or a buffered oxide etch (BOE) solution). If the HF acid solution is used, there is 0.5-8% of HF acid by mass percent. The silicon wafer is treated for 1-6 min and at 20-30° C. in the HF acid solution.

Figure 6:
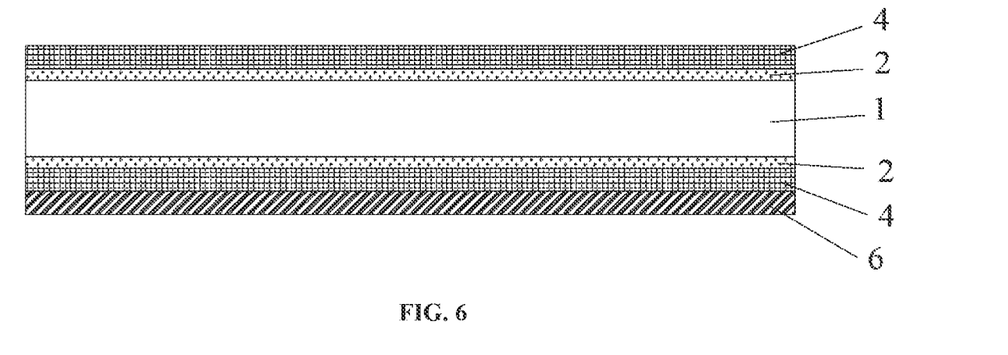
FIG. 6 is a schematic sectional view after a silicon nitride protective layer is deposited on a back surface of a silicon wafer according to an embodiment of the present disclosure.

(5) Silicon nitride protective layer 6 (mask layer) is deposited on a back surface of the silicon wafer 1 (as shown in FIG. 6). The silicon nitride protective layer in the present disclosure is strongly resistant to corrosion of the alkaline solution, and can withstand alkaline corrosion in a texturing solution. Preferably, the silicon nitride protective layer has a thickness of 700-2,000 Å. The silicon nitride layer may be formed by a thin-film forming method such as a sputtering method or a CVD method. Preferably, in the embodiment, the silicon nitride layer is deposited by PECVD.

Figure 7:
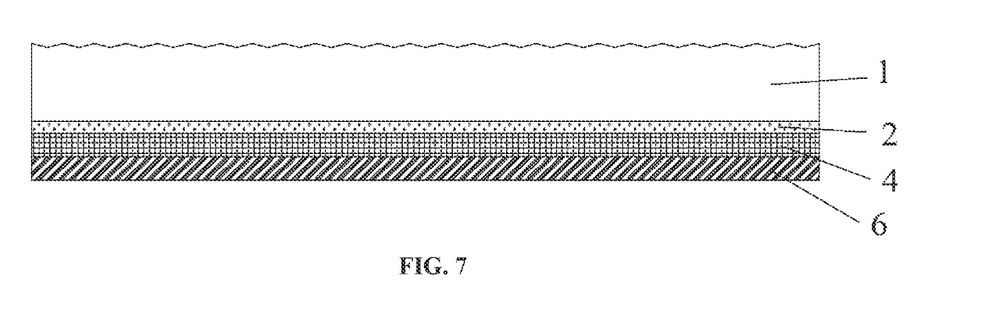
FIG. 7 is a schematic sectional view illustrating that a pyramid texture is formed on a front surface of a silicon wafer through texturing and cleaning according to an embodiment of the present disclosure.

(6) Single-sided texturing is performed on the silicon wafer (as shown in FIG. 7). An alkaline solution is used to prepare a texturing additive, thereby texturing the silicon wafer. Because of the silicon nitride protective layer 6 on the back surface of the silicon wafer, after the tunnel oxide layer 2 and the first intrinsic polysilicon layer on a front surface of the silicon wafer are removed, a pyramid texture is formed on the front surface of the silicon wafer. The texturing solution is a mixed solution of potassium hydroxide, the texturing additive and water. There are 1-5% of the potassium hydroxide and 0.5-1% of the texturing additive by mass percent. The texturing is performed for 8-30 min at 65-85° C.

Figure 8:
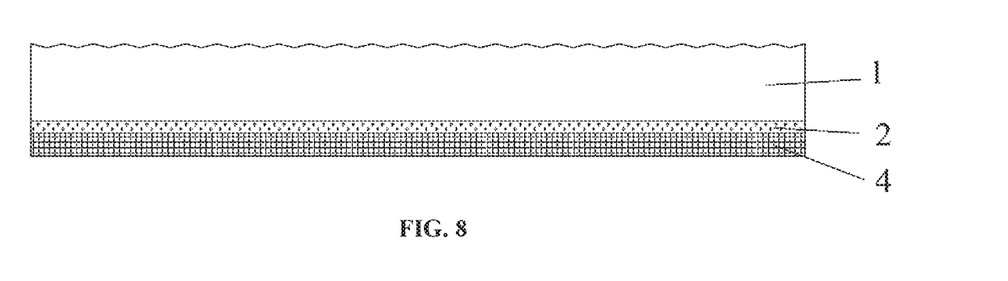
FIG. 8 is a schematic sectional view after a silicon nitride protective layer on a back surface of a silicon wafer is removed according to an embodiment of the present disclosure.

(7) The silicon nitride protective layer 6 on the back surface of the silicon wafer is removed (as shown in FIG. 8). A solution for removing the protective layer includes a fluorine-containing chemical solution (such as a diluted HF acid solution or a BOE solution). Time for removing the protective layer depends on a corrosion resistance of silicon nitride.

Figure 9:
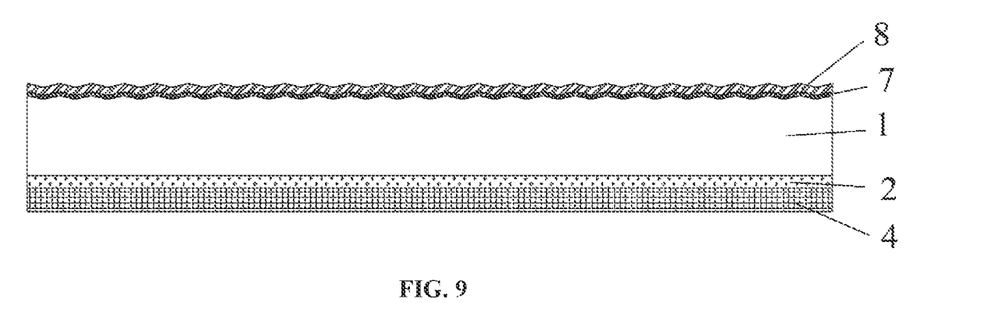
FIG. 9 is a schematic sectional view after a second intrinsic amorphous silicon layer and a P-type oxygen-doped microcrystalline silicon layer are sequentially deposited on a front surface of a silicon wafer according to an embodiment of the present disclosure.
Figure 13:
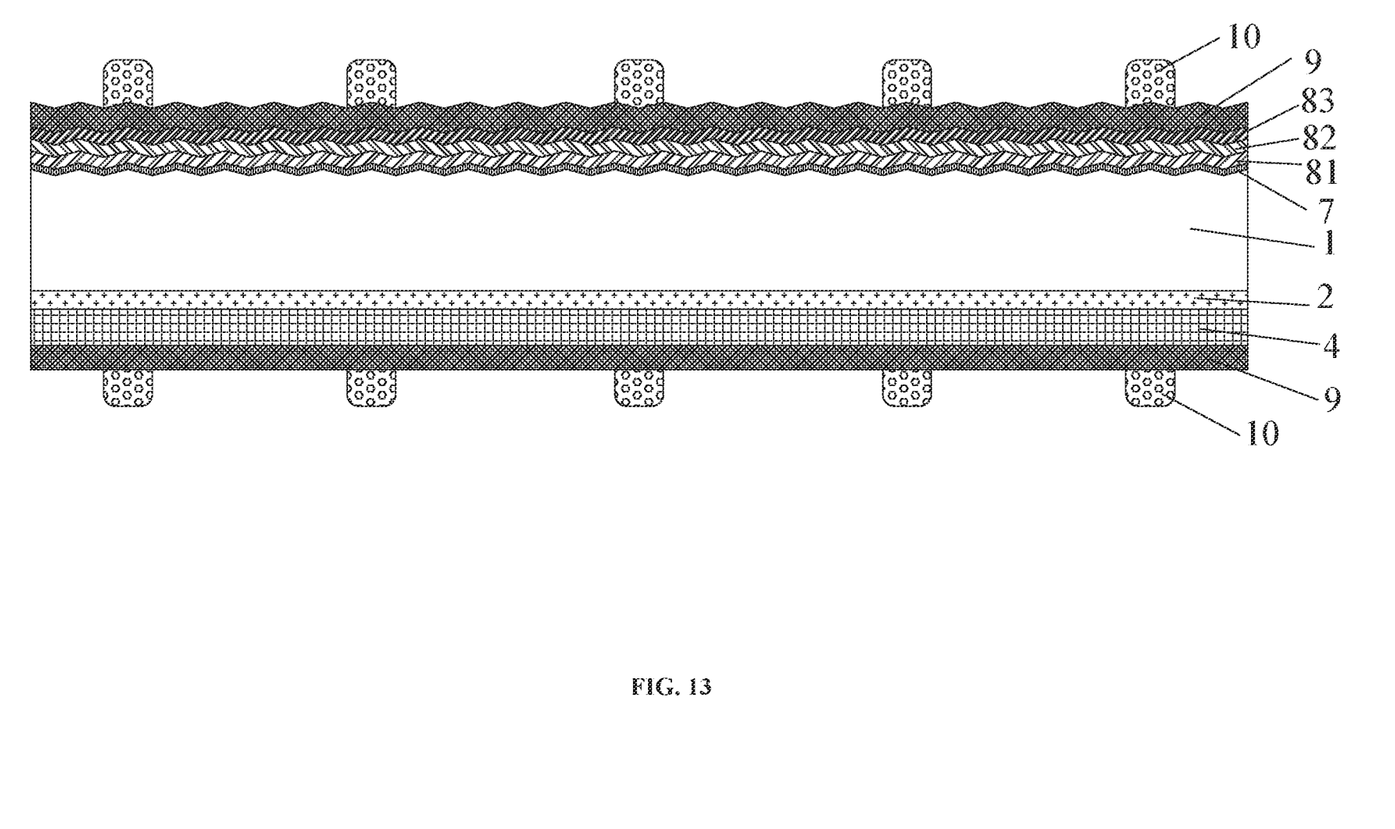
FIG. 13 is a schematic structural view of an efficient heterojunction solar cell according to an embodiment of the present disclosure.

(8) Second intrinsic amorphous silicon layer 7 and P-type oxygen-doped microcrystalline silicon layer 8 are sequentially deposited on the pyramid texture of the front surface of the silicon wafer (as shown in FIG. 9). The second intrinsic amorphous silicon layer is deposited by PECVD at 150-300° C. A mixed gas of silane, hydrogen or carbon dioxide is charged to a reaction chamber. There is 5-100% of the silane by molar content. The second intrinsic amorphous silicon layer has a thickness of 3-11 nm. The P-type oxygen-doped microcrystalline silicon layer is deposited by PEVCD. The silane, hydrogen, carbon dioxide and diborane-doped gas are charged for deposition, and a deposition thickness is 5-25 nm. In a preferred solution, as shown in FIG. 13, the P-type microcrystalline laminated layer 8 includes oxygen-free incubation layer 81, oxygen-containing microcrystalline layer 82, and oxygen-free microcrystalline layer 83 that are sequentially deposited by PEVCD. Each film layer of the P-type microcrystalline laminated layer is deposited by stepwise increasing a ratio of a P-type dopant gas to silane. The ratio of the P-type dopant gas to the silane is increased from 1:10 to 1:1. A corresponding proportion of the oxygen-free incubation layer to the oxygen-containing microcrystalline layer to the oxygen-free microcrystalline layer in thickness is (0.15-0.6):1:(0.5-1.5).

Figure 10:
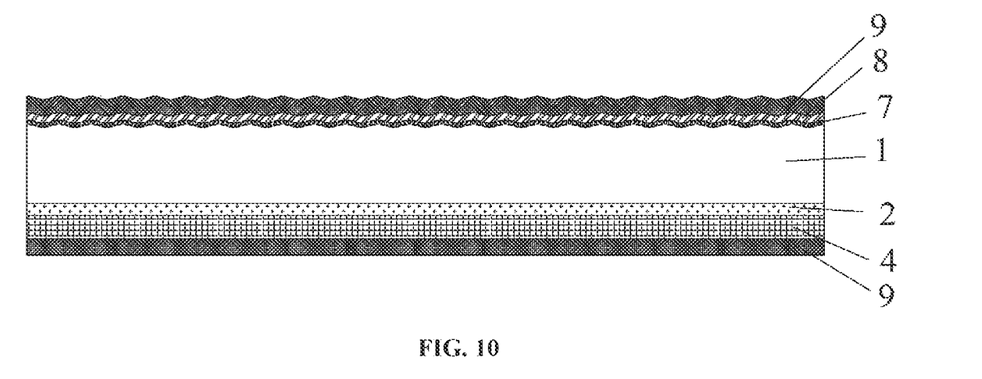
FIG. 10 is a schematic sectional view after transparent conductive layers are respectively deposited on a front surface and a back surface of a silicon wafer according to an embodiment of the present disclosure.

(9) Transparent conductive layers 9 (a first conductive film layer and a second conductive film layer) are respectively deposited on the front surface and the back surface of the silicon wafer (as shown in FIG. 10). The transparent conductive layer 9 is usually a transparent conductive oxide layer. The transparent conductive layer 9 may be an indium oxide film layer doped with one or more different metals (such as tin, tungsten and titanium), for example, an ITO layer, an IWO layer and an ITiO layer, or a zinc oxide film layer doped with one or more different metals (such as aluminum, indium and gallium), for example, an AZO layer, a GZO layer, an IZO layer and an IGZO layer. Preferably, the ITO layer (tin-doped indium oxide film layer) is used. Generally, the ITO layer is deposited by PVD, with a permeability of 88-99%, a sheet resistance of 30-400 Ω/square, and a thickness of 15-150 nm.

Figure 11:
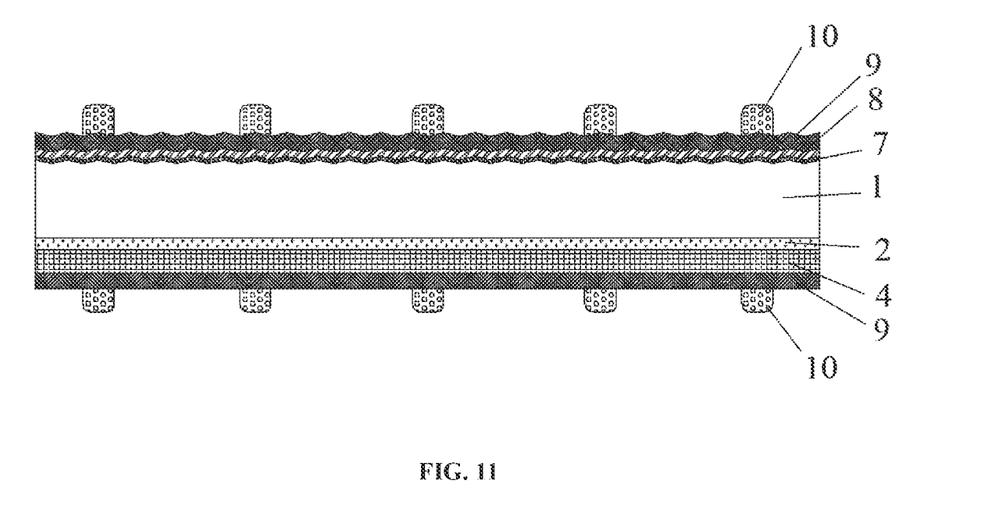
FIG. 11 is a schematic sectional view after metal grid electrodes are respectively formed on a front surface and a back surface of a silicon wafer according to an embodiment of the present disclosure.
Figure 12:
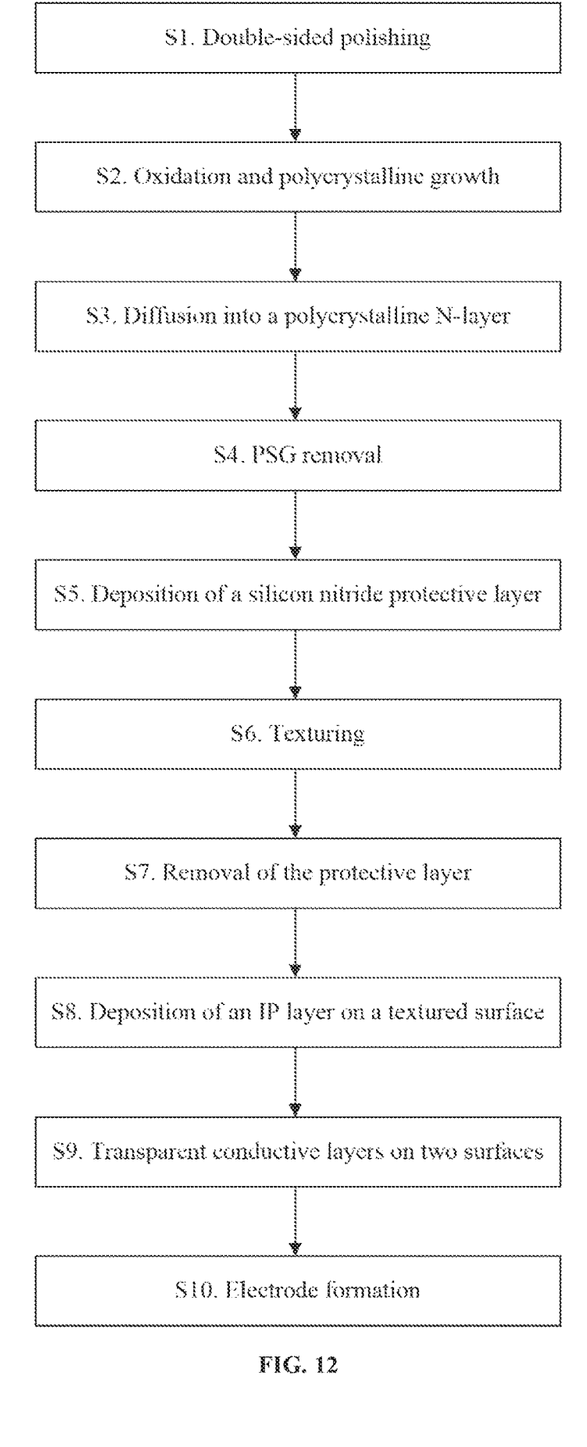
FIG. 12 is a flowchart for manufacturing an efficient heterojunction solar cell according to the present disclosure.

(10) Metal grid electrodes 10 (a first metal electrode and a second metal electrode) are respectively formed on the front surface and the back surface of the silicon wafer (as shown in FIG. 11), for ease of subsequent IV test.

The above are merely a preferred embodiment of the present disclosure, rather than a limit to a scope of the present disclosure.

| | Silane ($SiH_4$) | Hydrogen ($H_2$) | Diborane ($B_2H_6$) | $CO_2$ | Pressure (Pa) | Power density ($W/m^2$) |
|---|---|---|---|---|---|---|
| P1 (close to intrinsic amorphous silicon) | 1 | 150-1000 | 0-1 | 0 | 100-500 | 500-2500 |
| P2 | 1 | 500-1200 | 1-5 | 0.2-2 | 200-600 | 1500-5000 |
| P3 (close to the transparent conductive film) | 1 | 10-300 | 2-10 | 0 | 60-300 | 1000-5000 |

The above table shows process parameters in various stages for preparing the P-type oxygen-doped microcrystalline silicon layer by PEVCD. In preparation of the P-type oxygen-doped microcrystalline silicon layer, there are P1, P2 and P3 stages corresponding to the first oxygen-free incubation layer 81, the oxygen-containing microcrystalline layer 82, and the second oxygen-free microcrystalline layer 83 in FIG. 13. In a preferred solution, each film layer of the P-type oxygen-doped microcrystalline silicon layer is deposited by stepwise increasing a ratio of a P-type dopant gas to silane. The ratio of the P-type dopant gas to the silane is increased from 1:10 to 1:1.

| | Isc (short-circuit current) | Voc (open-circuit voltage) | FF (fill factor) | Conversion efficiency |
|---|---|---|---|---|
| A: TOPCON | 1.022 | 0.962 | 1.000 | 0.983 |
| B: heterojunction | 1.000 | 1.000 | 1.000 | 1.000 |
| C: present disclosure (TOPCON on the back surface, and heterojunction on the front surface) | 0.990 | 0.998 | 1.010 | 0.998 |

The above table shows a comparison of three photovoltaic cell technologies in typical electrical property, namely A: a TOPCON technology, B: a heterojunction technology, and C: related hybrid passivation technology in the present disclosure.

A heterojunction solar cell includes the first electrode, the first conductive film layer, the P-type microcrystalline laminated layer, the intrinsic film layer, the semiconductor substrate, the tunnel oxide layer, the N-type semiconductor film layer, the second conductive film layer, and the second electrode that are sequentially stacked from a light-facing surface to a backlight surface. The P-type microcrystalline laminated layer includes at least one oxygen-containing microcrystalline layer and at least one oxygen-free microcrystalline layer. The second conductive film layer covers the N-type semiconductor film layer. The second electrode is provided on a surface of the second conductive film layer, thereby forming full contact between the conductive film layer and the semiconductor film layer. This prevents transverse flow of a current in the semiconductor film layer, and improves a conductivity.

The semiconductor substrate is the monocrystalline silicon wafer. The pyramid texture is provided on the light-facing surface of the semiconductor substrate. The backlight surface of the semiconductor substrate is a chemically polished surface.

The intrinsic film layer is a hydrogenated intrinsic amorphous silicon layer, and has a thickness of 3-12 nm. The P-type microcrystalline laminated layer has a thickness of 9-45 nm.

The N-type semiconductor film layer is the N-type polysilicon layer.

The tunnel oxide layer has a thickness of 1-2 nm. The N-type polysilicon layer has a thickness of 20-300 nm, and a sheet resistance of 30-200 Ω/square.

A highly doped crystalline silicon film layer is provided between the N-type semiconductor film layer and the second conductive film layer. The highly doped crystalline silicon film layer has a thickness of 0.3-3 nm, and a doping concentration of $1 \times 10^{19}$-$2 \times 10^{20}$ $cm^3$. Different from a conventional heterojunction thin-film technology, polysilicon is very likely to form a silicon oxide thin layer at a low temperature. With a thickness of about 1 nm, the silicon oxide thin layer is formed on the N-type polysilicon layer 4 to cause dramatic decrease of the conductivity. The highly doped crystalline silicon film layer is an N-type doped (such as phosphorous doped) polysilicon thin film, or an N-type doped microcrystalline silicon thin film, or a microcrystalline and amorphous hybrid silicon thin film, and is formed by chemical deposition or physical bombardment. With a higher N-type doping rate than the N-type semiconductor film layer and a higher disordered state than the N-type semiconductor film layer, the highly doped crystalline silicon film layer is not prone to oxidation. The highly doped crystalline silicon film layer is very thin, and generally has a polycrystalline state, a microcrystalline state, and a polycrystalline and microcrystalline hybrid state. In a preferred solution, a microcrystallization rate of the highly doped crystalline silicon film layer is controlled at 10-70%. The N-type doping rate of the highly doped crystalline silicon film layer is 1-5 times the N-type doping rate of the N-type semiconductor film layer.

The P-type microcrystalline laminated layer and the N-type semiconductor film layer have a conductive doping concentration of $1\times10^{19}$-$2\times10^{20}$ cm$^{-3}$.

The first conductive film layer and/or the second conductive film layer are a transparent conductive film layer. The transparent conductive film layer is one or more of an indium tin oxide (ITO) film layer, a tungsten-doped indium oxide (IWO) film layer, an indium gallium zinc oxide (IGZO) film layer, an aluminum-doped zinc oxide (AZO) film layer, a zinc-doped indium oxide (IZO) film layer, a gallium-doped zinc oxide (GZO) film layer, and a titanium-doped indium oxide (ITiO) film layer.

The first conductive film layer has a thickness of 60-110 nm, and the second conductive film layer has a thickness of 15-50 nm.

In the P-type microcrystalline laminated layer, the oxygen-containing microcrystalline layer has a thickness of 5-20 nm, and the oxygen-free microcrystalline layer has a thickness of 5-20 nm.

The P-type microcrystalline laminated layer includes the oxygen-free microcrystalline layer, the oxygen-containing microcrystalline layer, and the oxygen-free incubation layer that are sequentially stacked from the light-facing surface to the backlight surface. The corresponding proportion of the oxygen-free microcrystalline layer to the oxygen-containing microcrystalline layer to the oxygen-free incubation layer in thickness is (0.5-1.5):1:(0.15-0.6).

Each film layer in the P-type oxygen-doped microcrystalline silicon layer is deposited by stepwise increasing the ratio of the P-type dopant gas to the silane.

Embodiment 2

Figure 14:
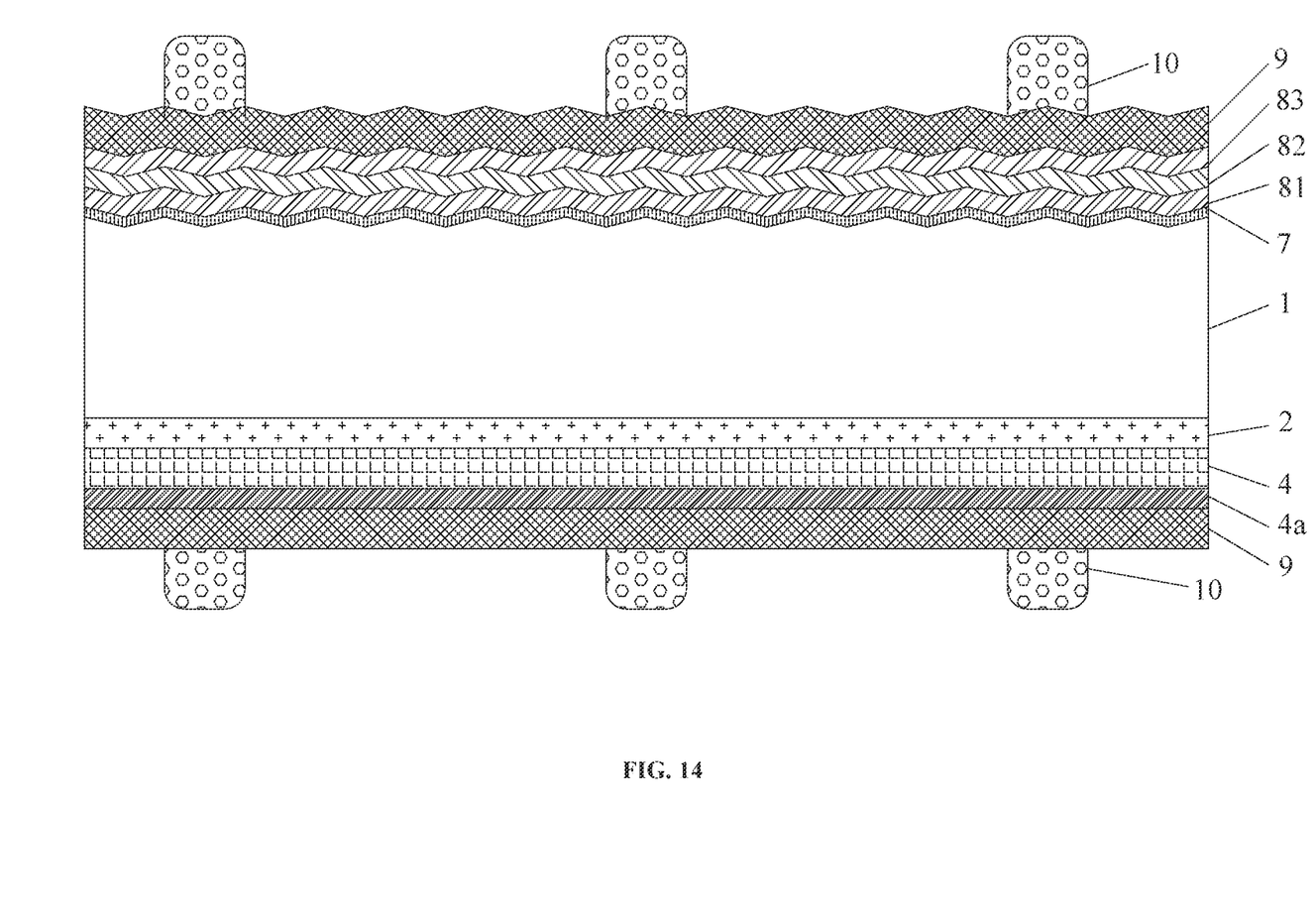
FIG. 14 is a schematic structural view of an efficient heterojunction solar cell according to an embodiment of the present disclosure.

The present disclosure will be described in detail below with reference to the drawings and Embodiment 2:

FIG. 14 is a schematic view of a heterojunction solar cell according to an embodiment of the present disclosure.

A heterojunction solar cell includes a first electrode, a first conductive film layer, a P-type microcrystalline laminated layer, an intrinsic film layer, a semiconductor substrate, tunnel oxide layer 2, an N-type semiconductor film layer, a second conductive film layer, and a second electrode that are sequentially stacked from a light-facing surface to a backlight surface.

The second conductive film layer covers the N-type semiconductor film layer. The second electrode is provided on a surface of the second conductive film layer, thereby forming full contact between the conductive film layer and the semiconductor film layer. This prevents transverse flow of a current in the semiconductor film layer, and improves a conductivity.

The semiconductor substrate is monocrystalline silicon wafer 1. A pyramid texture is provided on the light-facing surface of the semiconductor substrate. The backlight surface of the semiconductor substrate is a chemically polished surface.

The intrinsic film layer is a hydrogenated intrinsic amorphous silicon layer (second intrinsic amorphous silicon layer 7), and has a thickness of 3-12 nm. The P-type microcrystalline laminated layer has a thickness of 9-45 nm.

The N-type semiconductor film layer is N-type polysilicon layer 4.

Highly doped crystalline silicon film layer 4a is provided between the N-type semiconductor film layer and the second conductive film layer.

The first conductive film layer and the second conductive film layer are transparent conductive film layers (transparent conductive layers 9).

The P-type microcrystalline laminated layer includes an oxygen-free microcrystalline layer (second oxygen-free microcrystalline layer 83), oxygen-containing microcrystalline layer 82, and an oxygen-free incubation layer (first oxygen-free microcrystalline layer 81) that are sequentially stacked from the light-facing surface to the backlight surface.

The first electrode and the second electrode are metal grid electrodes 10.

It will be apparent to those skilled in the art that various modifications and variations can be made to the present disclosure without departing from the spirit and scope of the present disclosure. Thus, provided that these modifications and variations of the present disclosure fall within the scope of the claims of the present disclosure and their equivalents, the present disclosure will also be intended to include these modifications and variations.

What is claimed is:

1. A manufacturing method of a heterojunction solar cell, comprising the following steps:
   A: forming a tunnel oxide layer on a surface of a semiconductor substrate;
   B: forming an N-type polysilicon layer on the tunnel oxide layer;
   C: forming a mask layer on the N-type polysilicon layer of a first main surface of the semiconductor substrate;
   D: performing texturing and cleaning on a second main surface of the semiconductor substrate, and removing the mask layer;
   E: forming a second intrinsic amorphous silicon layer on the second main surface of the semiconductor substrate; and
   F: forming a laminated P-type oxygen-doped microcrystalline silicon layer consisting of a first oxygen-free incubation layer, an oxygen-containing microcrystalline layer, and a second oxygen-free microcrystalline layer on the second intrinsic amorphous silicon layer that are sequentially stacked from a backlight surface to a light-facing surface by plasma-enhanced CVD (PECVD), and
   a corresponding proportion of the second oxygen-free microcrystalline layer to the oxygen-containing microcrystalline layer to the first oxygen-free incubation layer in thickness is (0.5-1.5):1:(0.15-0.6).

2. The manufacturing method according to claim 1, wherein step C comprises: depositing at least one of silicon nitride, silicon oxynitride and silicon oxide on the N-type polysilicon layer by plasma chemical vapor deposition (PCVD) or high-temperature CVD to form the mask layer.

3. The manufacturing method according to claim 2, wherein the mask layer has a thickness of 30-150 nm.

4. The manufacturing method according to claim 1, wherein step D comprises: forming a pyramid texture on the second main surface of the semiconductor substrate through the texturing and the cleaning, and removing the mask layer with a fluorine-containing acidic solution.

5. The manufacturing method according to claim 1, wherein in step F, each film layer of the P-type oxygen-doped microcrystalline silicon layer is deposited by stepwise increasing a ratio of a P-type dopant gas to silane.

6. The manufacturing method according to claim 1, wherein step A comprises: forming the tunnel oxide layer on the surface of the semiconductor substrate by nitric acid oxidation, ozone oxidation, vacuum plasma-assisted oxidation or thermal oxidation.

7. The manufacturing method according to claim 6, wherein step A and step B comprise: putting the semiconductor substrate into a tubular low-pressure CVD (LPCVD) device, and thermally oxidizing the semiconductor substrate for 30 min at 550-650° C. to form the tunnel oxide layer;
performing vacuumization, and charging a reactant gas to grow a first intrinsic polysilicon layer at 550-650° C. and 5-10,000 Pa, wherein the first intrinsic polysilicon layer has a thickness of 20-300 nm;
performing phosphorus doping on the first intrinsic polysilicon layer with diffusion annealing to form the N-type polysilicon layer and a phosphorosilicate glass (PSG) layer; and
removing the PSG layer with a fluorine-containing acidic solution.

8. The manufacturing method according to claim 6, wherein the tunnel oxide layer has a thickness of 1-2 nm; the N-type polysilicon layer has a thickness of 20-300 nm; and the P-type oxygen-doped microcrystalline silicon layer has a thickness of 5-25 nm.

9. A heterojunction solar cell fabricated by the manufacturing method according to claim 1, comprising a first electrode, a first conductive film layer, a P-type microcrystalline laminated layer, an intrinsic film layer, the semiconductor substrate, the tunnel oxide layer, an N-type semiconductor film layer, a second conductive film layer, and a second electrode that are sequentially stacked from a light-facing surface to a backlight surface.

10. The heterojunction solar cell according to claim 9, wherein the semiconductor substrate is a monocrystalline silicon wafer, a pyramid texture is provided on the light-facing surface of the semiconductor substrate, and the backlight surface of the semiconductor substrate is a chemically polished surface.

11. The heterojunction solar cell according to claim 9, wherein a highly doped crystalline silicon film layer is provided between the N-type semiconductor film layer and the second conductive film layer.

12. The heterojunction solar cell according to claim 11, wherein the highly doped crystalline silicon film layer has a thickness of 0.3-3 nm, and a doping concentration of $1\times10^{19}$–$2\times10^{20}$ cm$^{-3}$.

13. The manufacturing method according to claim 2, wherein step A comprises: forming the tunnel oxide layer on the surface of the semiconductor substrate by nitric acid oxidation, ozone oxidation, vacuum plasma-assisted oxidation or thermal oxidation.

14. The manufacturing method according to claim 3, wherein step A comprises: forming the tunnel oxide layer on the surface of the semiconductor substrate by nitric acid oxidation, ozone oxidation, vacuum plasma-assisted oxidation or thermal oxidation.

15. The manufacturing method according to claim 4, wherein step A comprises: forming the tunnel oxide layer on the surface of the semiconductor substrate by nitric acid oxidation, ozone oxidation, vacuum plasma-assisted oxidation or thermal oxidation.

16. The manufacturing method according to claim 5, wherein step A comprises: forming the tunnel oxide layer on the surface of the semiconductor substrate by nitric acid oxidation, ozone oxidation, vacuum plasma-assisted oxidation or thermal oxidation.

17. The heterojunction solar cell according to claim 9, wherein in the manufacturing method, step C comprises: depositing at least one of silicon nitride, silicon oxynitride and silicon oxide on the N-type polysilicon layer by PCVD or high-temperature CVD to form the mask layer.

\* \* \* \* \*